United States Patent
Evans et al.

(10) Patent No.: US 9,285,778 B1
(45) Date of Patent: Mar. 15, 2016

(54) TIME TO DIGITAL CONVERTER WITH SUCCESSIVE APPROXIMATION ARCHITECTURE

(71) Applicant: CADENCE DESIGN SYSTEMS, INC., San Jose, CA (US)

(72) Inventors: William P. Evans, Catonsville, MD (US); Anthony Caviglia, Marriottsville, MD (US); Eric Naviasky, Ellicott City, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/828,728

(22) Filed: Aug. 18, 2015

(51) Int. Cl.
| | |
|---|---|
| H03M 1/50 | (2006.01) |
| G04F 10/00 | (2006.01) |
| H03M 1/46 | (2006.01) |
| H03L 7/08 | (2006.01) |

(52) U.S. Cl.
CPC ............ *G04F 10/005* (2013.01); *H03L 7/0805* (2013.01); *H03M 1/466* (2013.01)

(58) Field of Classification Search
CPC ... H03M 1/466; H03L 7/0891; H03L 7/0805; H03L 7/087
USPC .......... 341/118, 155, 166, 144, 163, 172, 153
See application file for complete search history.

(56) References Cited

U.S. PATENT DOCUMENTS

| | | | | |
|---|---|---|---|---|
| 7,095,287 B2* | 8/2006 | Maxim | ................. | H03L 7/0893 331/11 |
| 2012/0286980 A1* | 11/2012 | Park | ...................... | H03M 1/145 341/110 |
| 2015/0180486 A1* | 6/2015 | Shanan | ................... | H03L 7/099 327/156 |

OTHER PUBLICATIONS

P. Harpe, C. Zhou, X. Wang, G. Dolmans, H. De Groot, A 30fJ Conversion-Step 8b 0-to-10MS/s Asynchronous SAR ADC in 90nm CMOS, IEEE International Solid-State Circuits Conference, Session 21, 2010.

* cited by examiner

*Primary Examiner* — Peguy Jean Pierre
(74) *Attorney, Agent, or Firm* — Rosenberg, Klein & Lee (57) ABSTRACT

A time to digital converter with a successive approximation architecture (300) and a method thereof is provided. The time to digital converter (300) includes successive approximation analog to digital converter circuitry (310) configured for converting the differential voltage established in the digital to analog converter (305) of the successive approximation analog to digital converter circuitry (310) to a digital representation thereof, where the differential voltage corresponds to a measured time period representing a time difference between receipt of leading edges of two signals. Time to digital converter (300) may incorporate a current switching unit (340') having a plurality of current switching circuits (303a-303n, 304a-304n) arranged in parallel to increase the precision of digital time output of time to digital converter (300). The plurality of current switching circuits (303a-303n, 304a-304n) can be selectively enabled to alter the sensitivity of the time to digital converter (300).

26 Claims, 8 Drawing Sheets

TIME TO DIGITAL CONVERTER WITH SUCCESSIVE APPROXIMATION ARCHITECTURE

BACKGROUND OF THE INVENTION

The present disclosure is generally directed to time to digital converters and a method of converting a measured time period representing a difference in receipt of the leading edges of a pair of signals, to a digital representation thereof. More specifically, the subject system is directed to a time to digital converter that includes a phase-frequency detection circuit that generates up and down control signals having respective pulse widths wherein the pulse width of one of the two control signals represents a time difference in receipt of rising edges of two signals input thereto. Further, the system is directed to a time to digital converter incorporating a current switching unit that generates up and down current signals, each being switched on for a time period equivalent to the pulse width of a corresponding one of up and down control signals output by the phase-frequency detection circuit. Still further, the time to digital converter includes a successive approximation analog to digital converter circuit having a capacitor digital to analog converter for generating a respective voltage corresponding to each of the up and down current signals. The successive approximation analog to digital converter circuit generates a digital representation of the difference between the voltages, which corresponds to the measured time period. Additionally, the time to digital converter includes a current switching unit that has programmable sensitivity that allows for generating the digital representation of the measured time with greater precision.

Still further, the present disclosure is directed to a method of converting a time period corresponding to a time difference between receipt of rising edges of two signals to a digital representation thereof. In particular, the method includes detection of a rising edge of each of two input signals and measuring a time difference therebetween and generating two control signals having a difference in pulse width therebetween equivalent to the measured time difference. Further, the method includes redistributing charge, respectively, with respect to a pair of arrays of binary-weighted capacitors responsive to the two control signals to establish corresponding voltages across each array. The voltages across the two arrays are successively compared and the results thereof stored in a register to generate the digital representation of the measured time difference.

Figure 1:
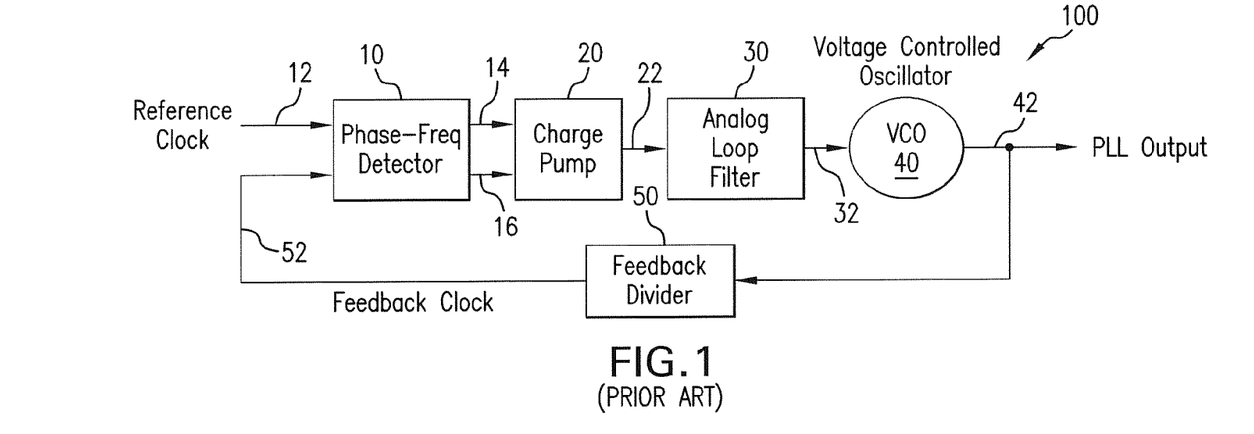
FIG. 1 is a simplified block diagram of a conventional analog phase locked loop.

Analog phase locked loops have been in use for many years. A basic block diagram for a typical analog phase locked loop (PLL) 100 is shown in FIG. 1. In an analog PLL 100, the PLL 100 "locks" the apparent phase between a reference clock 12 and a divided down feedback clock 52. The difference in apparent phase between the leading edge of these two clocks 12 and 52 is determined by a phase-frequency detector 10 and which generates an "up" pulse 14 and a "down" pulse 16 that is output by the phase-frequency detector 10 to a charge pump 20. The charge pump adds or subtracts charge using a well-known circuit called a charge pump. The charge pump 20 outputs the pulses of charge on coupling line 22 to a loop filter 30 which filters these pulses of charge. The output of the loop filter 30 is fed to the input of a voltage controlled oscillator (VCO) 40 via the coupling line 32. The output 42 of the VCO is fed to a feedback divider 50 which divides down the output of the VCO 40 to feed the divided signal back to the phase-frequency detector 10 through the coupling line 52 to thereby close the "loop" of the PLL 100.

Figure 2:
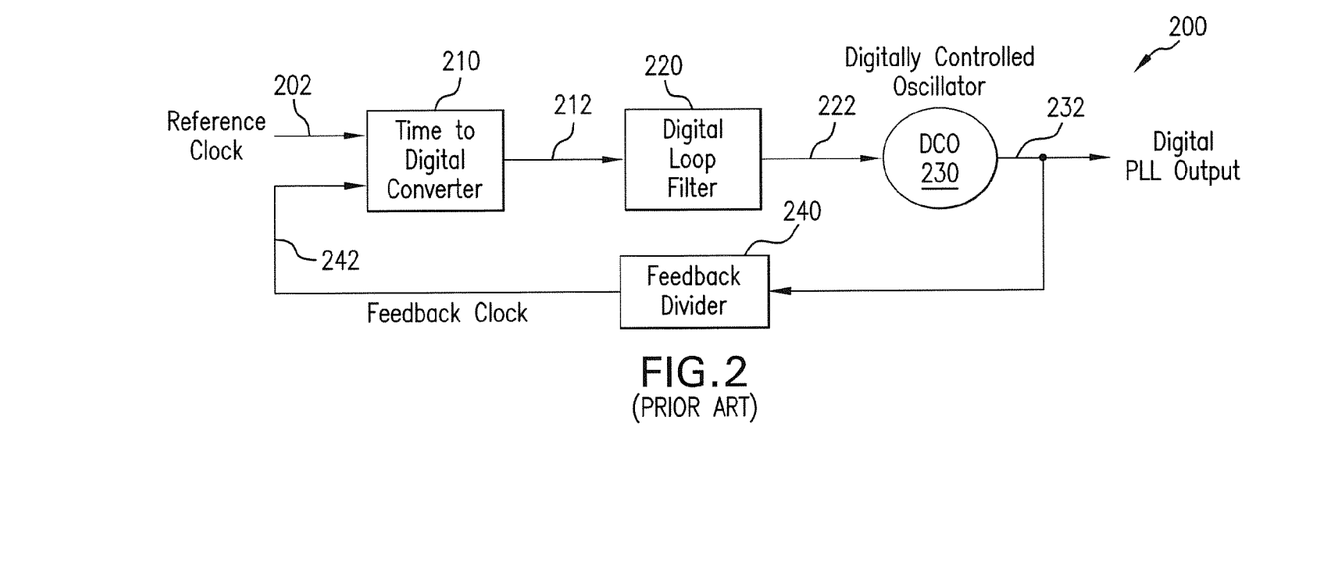
FIG. 2 is a simplified block diagram of a conventional digital phase locked loop.

The wide use of digital processing in systems that heretofore were constructed of analog circuits has driven the demand for digital systems to replace those that had been constructed from analog circuits. The architecture of a typical digital PLL 200 is shown in FIG. 2. In a digital PLL 200, the leading edge of the reference clock 202 is compared to the leading edge of the divided feedback clock 242 coming from the feedback divider 240, which divides the output 232 of the digitally controlled oscillator (DCO) 230. The circuit which makes this comparison is called a time to digital converter (TDC) 210. The output of the TDC 210 on coupling line or bus 212 is a digital word which fed into a digital loop filter 220 that then outputs through the coupling line or data bus 222 to drive the DCO 230 with a digital word.

The digital PLL 200 has several advantages over an analog PLL 100. For example, the loop filter is now a digital filter whose loop characteristics can be precisely controlled. Also a digital filter is often much smaller in chip area than that of an analog loop filter. Further, the digital loop filter can be easily adjusted to allow for a rapid lock time, and the digital loop allows for easy insertion of modulation if a spread spectrum output clock is desired. However, in order to gain these benefits from a Digital PLL 200 in state of the art systems, a TDC 210 must exist which can convert the time difference of the reference clock 202 leading edge and the feedback clock 242 leading edge to a digital word to drive the digital loop filter, both with precision and at high speed.

SUMMARY OF THE INVENTION

A time to digital converter is provided that includes a phase-frequency detection circuit having a pair of inputs respectively receiving first and second signals. The phase-frequency detection circuit generates both an up control signal and a down control signal at corresponding outputs thereof. One of the up and down control signals has a pulse width representing a time difference between receipt of leading edges of the first and second signals. The time to digital converter also includes a capacitor digital to analog converter operatively coupled to the outputs of the phase-frequency detection circuit. The capacitor digital to analog converter has a pair of capacitor arrays each redistributing charge in correspondence to the pulse width of a corresponding one of the up and down control signals and sequentially switching selected capacitors of at least one of the pair of capacitor arrays to establish respective voltage output for each of the pair of capacitor arrays. The time to digital converter further includes a successive approximation logic and timing unit coupled to the capacitor digital to analog converter for controlling the sequential switching of the selected capacitors. The successive approximation logic and timing unit includes a successive approximation register. Further, the time to digital converter includes a comparator unit operatively coupled to the pair of capacitor arrays for comparing voltage outputs thereof and operatively coupled to the successive approximation logic and timing unit. The comparator unit has an output coupled to the successive approximation register. The comparator generates a bit value respectively for each of a plurality of bit conversion states established by the successive approximation logic and timing unit and outputs the bit values to the successive approximation register to form a digital representation of the time difference between receipt of leading edges of the first and second signals.

From another aspect, a time to digital converter is provided that includes a phase-frequency detection circuit having a pair of inputs respectively receiving first and second signals The phase-frequency detection circuit generates both an up control signal and a down control signal at corresponding outputs thereof. Each of the up and down control signals has a pulse width and one of the up and down control signals having the pulse width thereof representing a time difference between receipt of leading edges of the first and second signals. The digital converter further includes a current switching unit having a pair of inputs coupled to the phase-frequency detection circuit for receiving the up and down control signals. The current switching unit generates an up current signal for a first time period corresponding to the pulse width of the up control signal and generates a down current signal for a second time period corresponding to the pulse width of the down control signal. Further, the digital converter includes a successive approximation analog to digital converter having a capacitor digital to analog converter operatively coupled to the current switching unit for generating a respective voltage corresponding to each of the up and down current signals. The successive approximation analog to digital converter generates a digital representation of a difference between said voltages of the capacitor digital to analog converter to define the time difference between receipt of the leading edges of the first and second signals From yet another aspect, a time to digital converter is provided that includes a phase-frequency detection circuit having a pair of inputs respectively receiving first and second signals. The phase-frequency detection circuit generates both an up and a down control signal at corresponding outputs thereof. Each of the up and down control signals has a pulse width and one of the up and down control signals has the pulse width thereof representing a time difference between receipt of leading edges of the first and second signals. The time to digital converter further includes a current switching unit having a pair of inputs coupled to the phase-frequency detection circuit for receiving the up and down control signals. The current switching unit generates an up current signal for a first time period corresponding to the pulse width of the up control signal and generates a down current signal for a second time period corresponding to the pulse width of the down control signal. Further, the time to digital converter includes a successive approximation analog to digital converter having a capacitor digital to analog converter operatively coupled to the current switching unit for generating a respective voltage corresponding to each of the up and down current signals. The successive approximation analog to digital converter generates a digital representation of a difference between the voltages of the capacitor digital to analog converter to define the time difference between receipt of leading edges of the first and second signals. Still further, the time to digital converter includes a sensitivity selection control coupled to the current switching unit for selecting a magnitude of the up and down current signals for selectively establishing a rate of charge redistribution in the capacitor digital to analog converter to thereby select a precision of the digital representation of the difference between the voltages of the capacitor digital to analog converter.

From a still further aspect, a method of converting a measured time period representing a time difference between receipt of leading edges of a pair of signals to a digital representation thereof is provided. The method includes detecting a rising edge of each of the pair of signals and measuring a time difference therebetween. The method further includes generating two control signals with each having a pulse width where a difference in pulse width between the two control signals is equivalent to the measured time difference. Further, the method includes respectively redistributing charge in a pair of arrays of binary-weighted capacitors respectively responsive to the two control signals to establish corresponding voltages thereacross. A difference between the voltages across the pair of arrays of binary-weighted capacitors thereby is equivalent to the measured time difference. Still further, the method includes successively comparing the voltages established across selected ones of the binary-weighted capacitors between the pair of arrays of binary-weighted capacitors and storing a result thereof in a register to generate in the register a digital representation of the measured time difference.

DESCRIPTION OF THE PREFERRED EMBODIMENTS

Referring to FIGS. 3-8, there is shown a time to digital converter with a successive approximation architecture 300 employing successive approximation analog to digital converter circuitry (SAR ADC) 310 configured for converting the differential voltage established in the capacitor digital to analog converter (DAC) 305 to a digital representation thereof. Time to digital converter 300 is inherently less susceptible to power supply noise through use of the differential capacitor DAC 305 and a differential comparator 306. As will be described in following paragraphs, time to digital converter 300 may incorporate a current switching unit 340' having selectable current gain which provides selectable sensitivity for time to digital converter 300. The configuration of current switching unit 340', where a plurality of current switching circuits 303a-303n, 304a-304n are arranged in parallel is able to provide a selectable digital time output precision. In one exemplary system the selectable digital time output precision was selectable within the range from sixteen to one picosecond/LSB.

Figure 3:
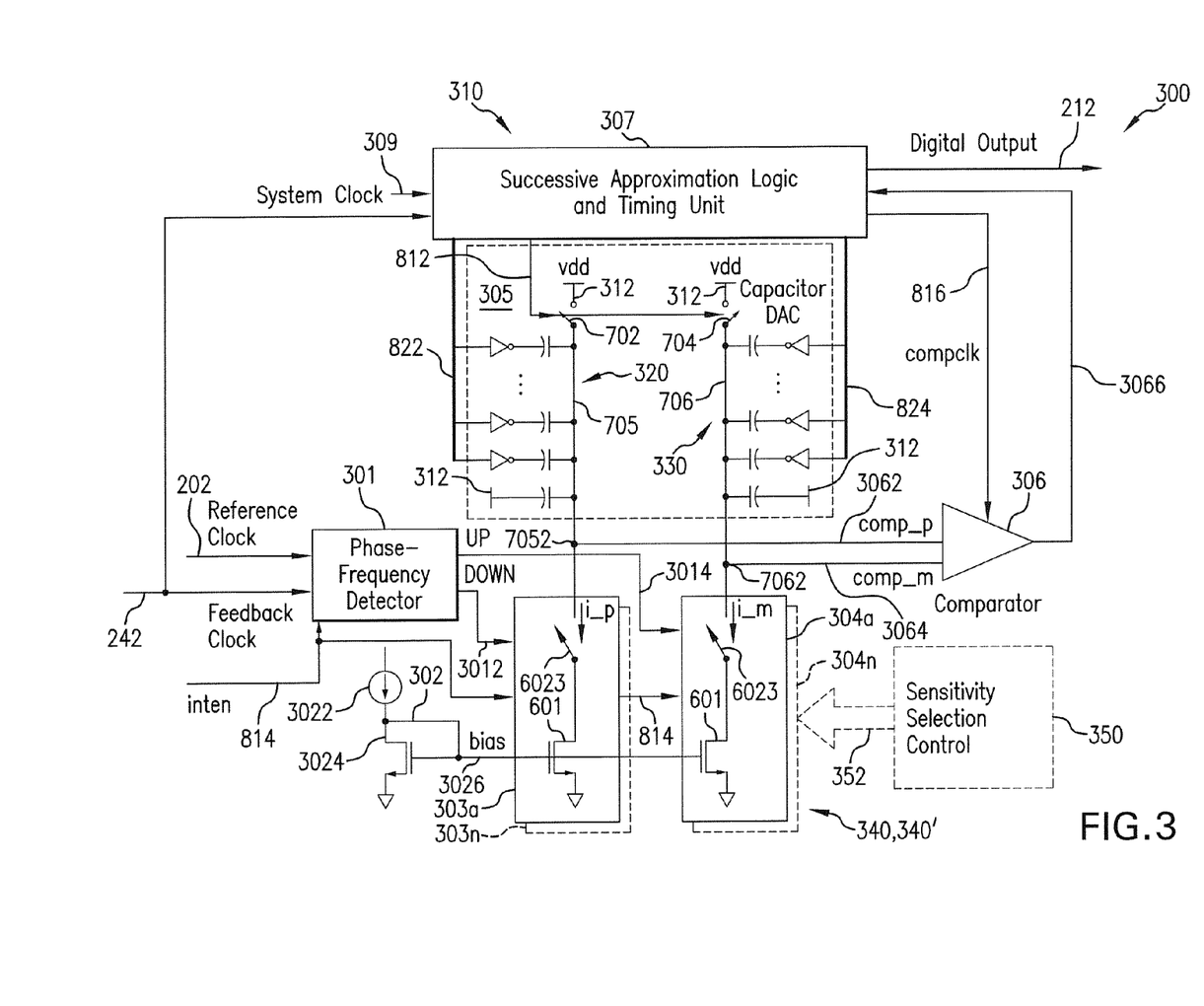
FIG. 3 s a schematic block diagram illustrating a time to digital converter in accordance with an exemplary embodiment of the present invention.

Referring specifically to FIG. 3, there is shown time to digital converter 300. Time to digital converter 300 includes a phase-frequency detector 301 for detecting an apparent phase difference between a pair of signals 202 and 242 input thereto. The apparent phase difference is represented by a difference in time between leading edges, which in the exemplary system are rising edges, of the pair of signals 202 and 242 input to the phase-frequency detector as a result of a frequency of phase difference between those signals. One signal is designated as the reference signal and input to a reference input terminal of phase-frequency detector 301, with the apparent phase of the other signal being compared thereto. In a digital phase locked loop application of the time to digital converter 300 (FIG. 2), the reference clock signal (refclk) 202 is coupled to the reference input of phase-frequency detector 301 and the other signal input receives the feedback clock signal (fbclk) 242 and receipt its leading edge compared relative to that of the reference clock signal 202. When the rising edges of the refclk signal 202 and the fbclk signal 242 are coincident, the PLL is said to be "locked" and the output 232 of digitally controlled oscillator 230 is "locked" at the desired frequency, as set by the refclk signal 202.

Phase-frequency detector 301 generates a pair of control signals 3012 and 3014, designated as DOWN signal 3012 and UP signal 3014, which are each a single pulse output during each computational cycle of time to digital converter 300. The pulse width of one of the DOWN or UP control signals corresponds to a measured time difference between rising edges of the reference clock signal 202 and the feedback clock signal 242, and is actually equivalent to that measured time difference plus a preset delay time. While the other of the UP or DOWN control signals has a pulse width equal to the preset delay time. Which one of the DOWN or UP control signals has a pulse width that corresponds to the measured time difference between rising edges of the signals is a function of whether the leading edge of the signal being compared with the reference signal is leading or lagging, for example, whether the rising edge of the feedback clock signal 242 is leading or lagging relative to the rising edge of the reference clock signal 202.

Figure 5:
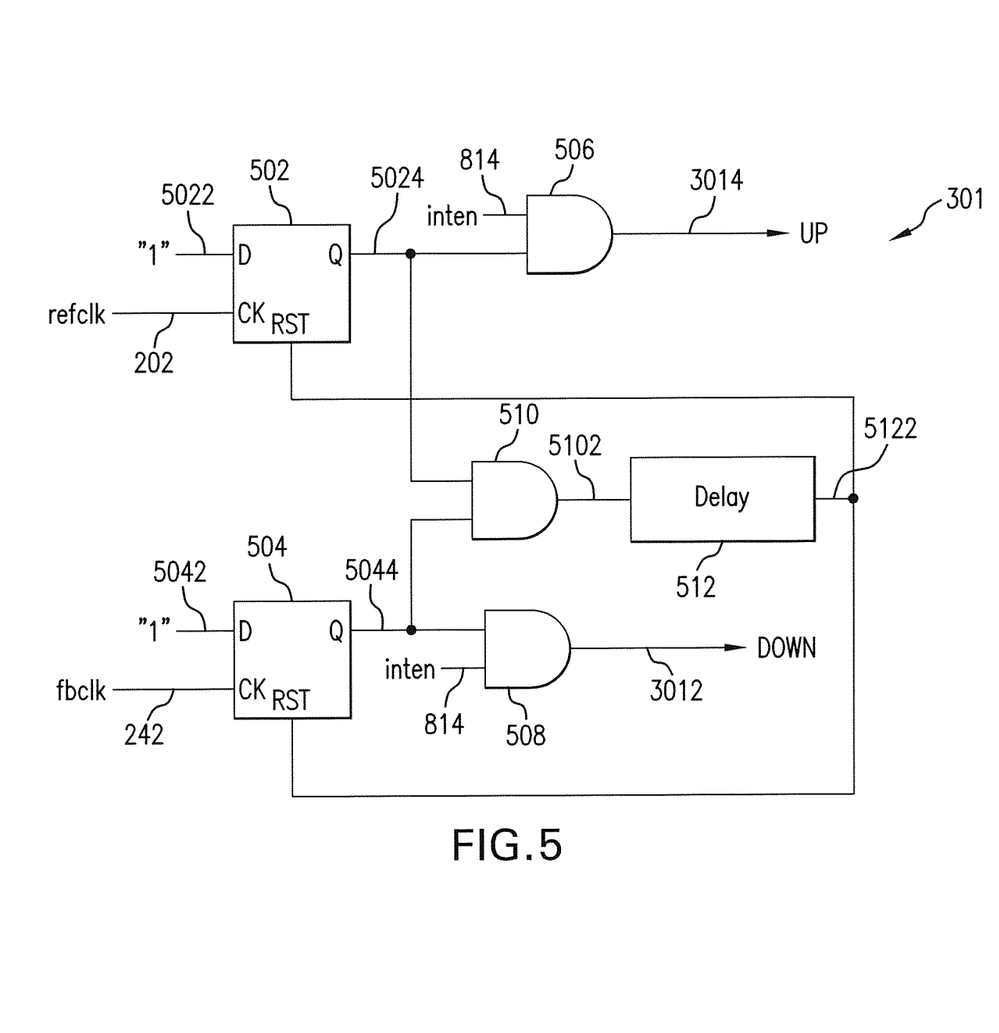
FIG. 5 is a simplified schematic diagram illustrating an exemplary phase-frequency detector usable in the time to digital converter of FIG. 3.

Referring additionally to FIG. 5, a simplified logic diagram of an exemplary conventional phase-frequency detector is shown that may be used in time to digital converter 300. Phase-frequency detector 301 includes a pair of edge triggered flip flops 502 and 504 for respectively receiving the refclk signal 202 and the fbclk signal 242. The D input of each of flip flops 502 and 504 is connected to a logic 1 potential and initially the Q outputs and reset (RST) inputs are at a logic 0. The clock input (CK) of flip flop 502 defines the reference input of the phase-frequency detector 301 and receives the refclk 202 signal. The clock input (CK) of flip flop 504 define the other signal input of the phase-frequency detector 301 and receives the fbclk 242 signal. Thus, when the flip flop 502 receive a rising edge of the refclk signal 202, the Q output of flip flop 502 goes to a logic 1 and remains at that level until a logic 1 signal is received at the RST input thereof. Similarly, when the flip flop 504 receive a rising edge of the fbclk signal 242, the Q output of flip flop 504 goes to a logic 1 and remains at that level until a logic 1 signal is received at the RST input thereof.

Responsive to the rising edge of the refclk signal 202 being received by flip flop 502, the Q output thereof goes to a logic 1 and is coupled to the AND gate 506 via the coupling line 5024. Likewise, in response to receipt of the rising edge of the fbclk signal 242 being received by flip flop 504, the Q output thereof goes to a logic 1 and is coupled to the AND gate 508 via the coupling line 5044. Both of AND gates 506 and 508 have inputs coupled to the integrate enable (inten) signal 814 and will therefore output a logic 1, which are the UP and DOWN signals 3014 and 3012, when both corresponding inputs thereof are at a logic 1. With reference to the timing diagram of FIG. 4, it can be seen that the iten signal 814 transitions to the logic 1 state, for the exemplary system, well in advance to the occurrence of the rising edge 402 of the reference clock signal 202. Accordingly, the rising edge 406 of the UP signal 3014 transitions to the logic 1 state, output from the AND gate 506, is coincident with the rising edge 402 of the refclk signal 202. In the example illustrated, the rising edge 404 of fbclk signal 242 lags that of the refclk signal 202 by a time period t, and thus, responsive to receipt of the rising edge 404 of fbclk signal 242, the transition of the DOWN signal 3012 to the logic 1 state, output from the AND gate 508, is coincident therewith.

The Q outputs of the flip flops 502 and 504 are also coupled to an AND gate 510 via the coupling lines 5024 and 5044. Therefore, once the rising edges of both refclk 202 and fbclk 242 have been received, AND gate 510 outputs a logic 1 to a delay circuit 512 which delays the propagation of that logic 1 input via coupling line 5102 through the delay circuit 512. Delay circuit 512 is conventionally constructed using a series arrangement of logic devices and may be configured to provide selectable delay times, as is well known in the art. At the completion of the propagation of that logic 1 through the delay circuit 512, delay circuit 512 outputs a logic 1, which marks the expiration of the delay time period. The output from delay circuit 512 is coupled to the RST inputs of both of the flip flops 502 and 504, to reset the Q outputs thereof back to a logic 0 state to begin detection of the next occurrence of rising edges, which concurrently resets the UP and DOWN signal outputs 3014 and 3012 and sets the RST inputs of flip flops 502 and 504 back to logic 0 after the delay set by delay cell 512.

Figure 4:
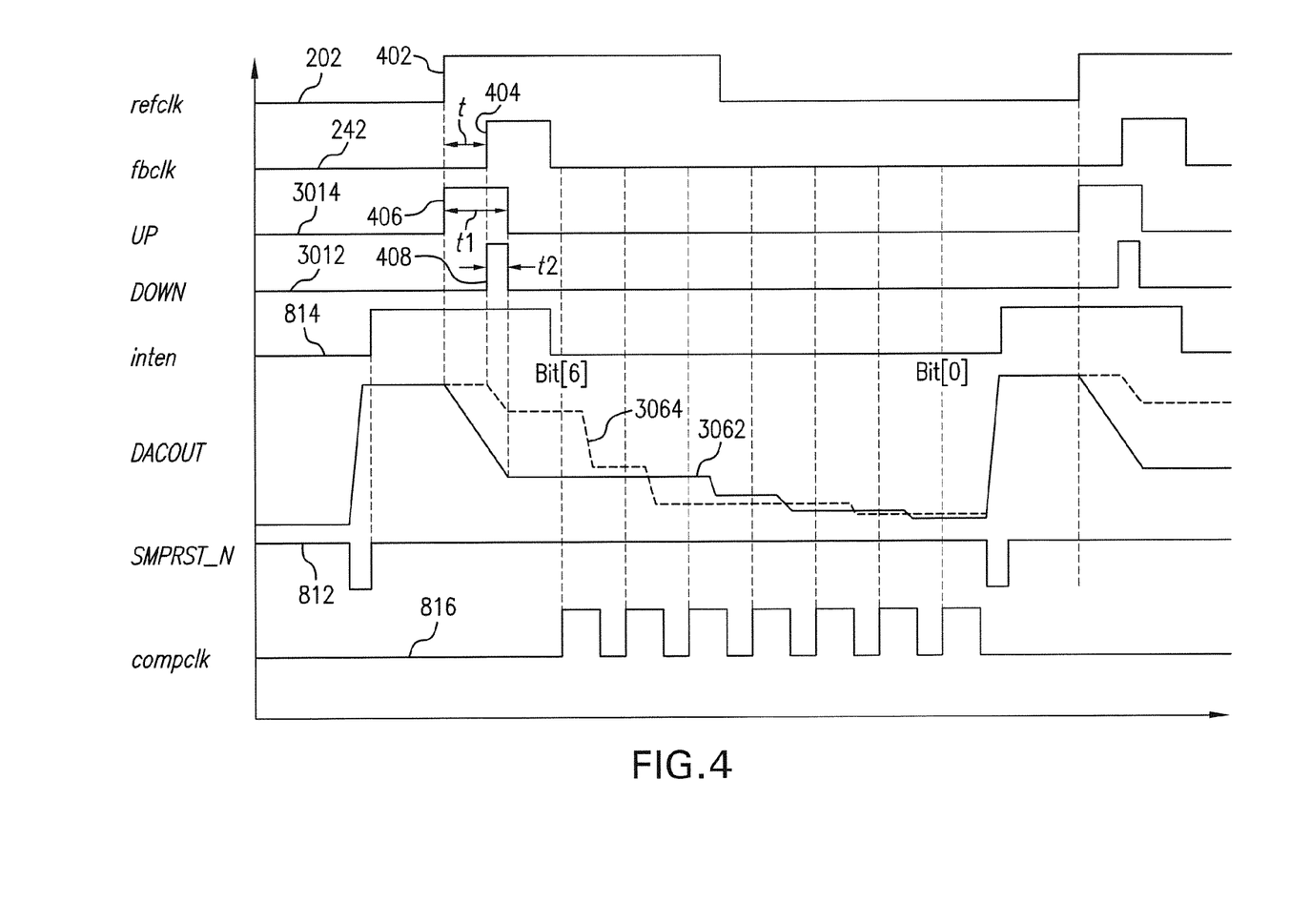
FIG. 4 is a timing diagram showing timing of operation of the phase-frequency detector and operation of the capacitor digital to analog converter portion of the digital to time converter of FIG. 3.

Since the rising edge 404 of the fbclk signal 242 is received subsequent to the rising edge 402 of the refclk signal 202, and the receipt of that second rising edge triggers the initiation of the DOWN signal 3012 and the start of the delay period, the expiration of which terminates both the UP and DOWN signal pulses, with the pulse width t2 of the DOWN signal 3012 is equal to the delay time period. As can be seen in the timing diagram, the pulse width t1 of the UP signal is equal to the time t between the rising edges 402 and 404 of the refclk signal 202 and the fbclk signal 242 plus the delay time, which is equal to t2. Hence, the difference between the pulse widths t1 and t2 provides the measurement of the time t between the rising edges 402 and 404 of refclk signal 202 and fbclk signal 242.

The time to digital converter 300 makes use of a current switching unit 340, 340' to convert the pulse widths of the UP and DOWN signals 3014 and 3012 to respective currents and employs successive approximation analog to digital converter circuitry 310 to correspondingly redistribute charge in a capacitor DAC 305 responsive to the respective currents and accordingly establish a differential voltage representing the difference in pulse width between the UP and DOWN signals 3014 and 3012. The differential voltage of the capacitor DAC is successively converted to a digital value using a successive approximation algorithm using the successive approximation logic and timing unit 307 to control the capacitor DAC 305 and comparator 306.

The current switching unit 340 includes at least one current switching circuit 304, 303 respectively coupled to the UP and DOWN signals 3014 and 3012 and may include a plurality of parallel connected current switching circuits 303a-303n coupled to the DOWN signal 3012 and a plurality of parallel connected current switching circuits 304a-304n coupled to the UP signal 3014. As will be described in following paragraphs, the plurality of current switching circuits 303a-303n and 304a-304n may optionally be selectively enabled by the sensitivity selection control 350 which outputs control signals on the bus 352 to vary the current gain of current switching unit 340' and thereby select the precision of the digital representation of time provided by time to digital converter 300.

In the simplified illustration of FIG. 3, the current switching unit 340 includes at least one current switching circuit 303 (and optionally a plurality of such current switching circuits connected in parallel) coupled to the DOWN signal 3012 and at least one current switching circuit 304 (and optionally a plurality of such current switching circuits connected in parallel) coupled to the UP signal 3014. Each of the current switching circuits 303 and 304 (and each switching circuit coupled in parallel therewith) includes a first NMOS transistor 601 biased by a bias signal 3026 output from the bias voltage source 302. It should be understood that while specific examples described herein may disclose particular transistors as being N or P type, such may be substituted with devices of the opposite type through use of the corresponding appropriate source to drain voltage and bias voltage or polarity of gate switching voltage applied thereto, as is well known in the art.

Figure 7:
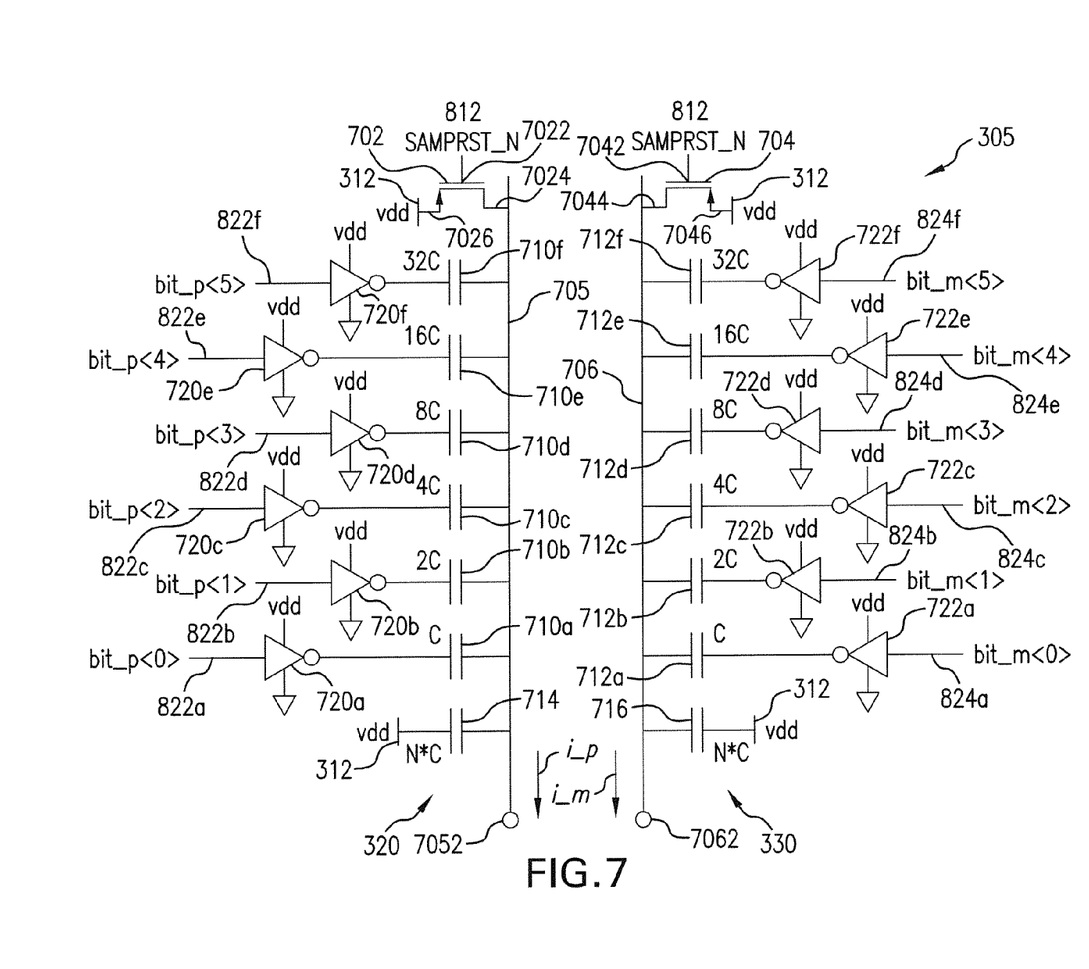
FIG. 7 a schematic diagram of a capacitor digital to analog converter of the successive approximation architecture of the present invention.

Bias voltage source 302 is formed by a constant current source 3022 coupled to a diode connected NMOS transistor 3024. The bias signal 3026 output from the bias voltage source 302 and coupled to the transistor 601 of the current switching circuits 303 and 304 establishes the current that will be "pulled" from the binary weighted capacitor arrays 320 and 330 of the capacitor DAC 305 during the charge redistribution portion of the successive approximation computational cycle. Each of the current switching circuits 303 and 304 further includes a switching device 6023 that conducts (switched "on") responsive to the corresponding DOWN signal 3012 or UP signal 3014 logic 1 pulse. In the exemplary circuit arrangement shown, when the DOWN signal 3012 goes to a logic 1, the switching device 6023 of current switching circuit 303 conducts, allowing the current ip, as established by the series connected transistor 601, to flow from the capacitor array common coupling line or net 705 to the node 7052 of the capacitor DAC 305 and through the current switching circuit 303. That current flow results in a redistribution of charge from the array of binary weighted capacitors 320 and establishes a corresponding voltage at the node 7052. Likewise, when the UP signal 3014 goes to a logic 1, the switching device 6023 of current switching circuit 304 conducts, allowing the current i_m, as established by the series connected transistor 601, to flow from the capacitor array common coupling line or net 706 to the node 7062 of the capacitor DAC 305 and through the current switching circuit 304. That current flow similarly results in a redistribution of charge from the array of binary weighted capacitors 330 and establishes a corresponding voltage at the node 7062. The operation of the capacitor DAC 305 will be described in greater detail in following paragraphs.

Subsequent to the resetting of the UP and DOWN pulse outputs, as previously described, the iten signal 814 will go to a logic 0. That transition is sufficiently delayed to allow the redistribution of charge in the capacitor DAC 305 to complete before the quantization of the voltage across the nodes 7052 and 7062 is initiated by the compclk signal 816, as can be seen in FIG. 4 and will be described further. It should be understood that while the capacitors of exemplary capacitor DAC 305 described herein are initially charged to the Vdd voltage, the logic 1 potential, and then charge subsequently removed by operation of the current switching unit 340, 340' during the charge redistribution phase of the operating cycle, such may be reversed, as is well known in the art. Thus, the capacitors of capacitor DAC 305 may initially be fully discharged to the ground reference voltage, the logic 0 potential, and then charge subsequently added by operation of the current switching unit 340, 340' during the charge redistribution phase of the operating cycle. By either method, the resulting redistributed charge in the capacitor DAC 305 will provide voltages in the corresponding arrays of weighted capacitors 320 and 330 which are each directly proportional to the pulse widths of the corresponding UP and DOWN signals 3014 and 3012. That fact is based on the well-known relationship between the charge/discharge current (i), the time period of charge/discharge (t), the total capacitance value of the capacitor/capacitor array (C) and the voltage across the capacitance (V), which is: $i*t=C*V$. Thus, the voltage across the capacitors is defined by $V=i*t/C$. Since each of the current switching circuits 303 and 304 switch a current of the same magnitude for a time period equal to the pulse width of the corresponding UP and DOWN signals 3014 and 3012, the voltages across the capacitor arrays 320 and 330 resulting from the charge redistribution phase will each be directly proportional to the pulse width of the corresponding DOWN and UP signals 3012 and 3014. Accordingly, the difference between those voltages will be proportional to the difference in time between the rising edges of the refclk 202 and fbclk 242, and consequently is just a matter of scaling to equate that voltage difference to units of time.

Figure 6A:
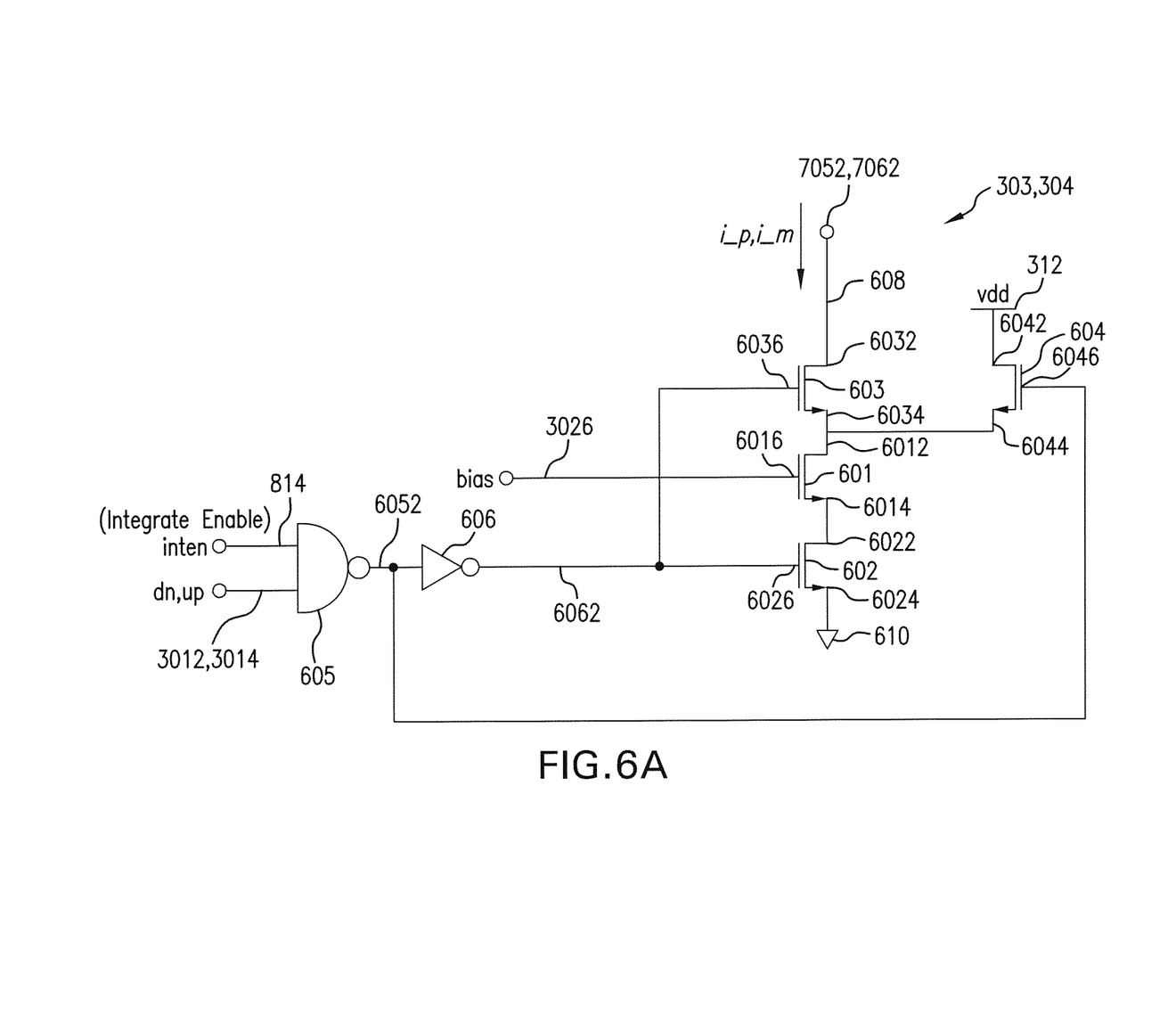
FIG. 6A is a schematic diagram illustrating a current switching circuit of the time to digital converter of FIG. 3.

The accuracy and precision of time to digital converter 300 is therefore very much dependent on the speed an linearity of the current switching circuits 303, 304 of the current switching unit 340, 340'. Referring now to FIG. 6A, there is shown a schematic illustration of a particular example of a current switching circuit 303, 304 usable in the current switching unit 340, 340' of time to digital converter 300. Each current switching circuit 303, 304 of current switching unit 340, 340' are identically constructed and correspond to the simplified illustration in FIG. 3. The current i_p, i_m which will flow from the node 7052, 7062 when the switch 6023 is enabled is established by the first NMOS transistor 601 in correspondence to the bias voltage 3026 supplied to the gate 6016 of transistor 601.

The switch 6023 may be formed by a single switching transistor, a second NMOS transistor, in series with transistor 601. However, greater linearity and speed is achieved through use of a pair of second NMOS transistors 602 and 603 coupled in series with transistor 601 in a configuration that provides both drain and source switching. The drain of 6032 of transistor 603 is connected to the corresponding node 7052, 7062 by the coupling line 608 and the source 6034 thereof is connected to the drain 6012 of transistor 601. The source 6014 of transistor 601 is connected to the drain 6022 of transistor 602, and the source 6024 of transistor 602 is connected to the common circuit ground reference 610 to complete a current path for the current i_p, i_m from node 7052, 7062 to the ground reference when the transistors 602 and 603 are switched to an on state.

As previously described, the current switching circuit 303 is switched on when both the inten signal 814, and the DOWN signal 3012 are both at logic 1 states, and likewise the current switching circuit 304 is switched on when both the inten signal 814, and the UP signal 3014 are both at logic 1 states. That anding function is provided by a NAND gate 605 having an output 6052 coupled to an inverter 606. The output of inverter 606 is coupled to the commonly coupled gates 6026 and 6036 of transistors 602 and 603. To further improve the linearity of the current switching circuit 303 and 304. a fourth NMOS transistor 604 is included that is switched to the on state in opposition to that of transistors 602 and 603. Transistor 604 has its drain 6042 coupled to the positive supply voltage Vdd 312 and its source coupled to the drain 6012 of transistor 601. The gate 6046 of transistor 604 is coupled to the output 6052 of NAND gate 605. Hence, by that arrangement transistor 604 conducts the Vdd voltage to the drain 6012 of transistor 601 when transistors 602 and 603 are turned off. Since transistors 602 and 603 are turned off, there is substantially no current flow through transistor 604, and therefore transistor 604 can be of very small size relative to transistors 601, 602 and 603 and conserve valuable integrated circuit "real estate." The application of the Vdd voltage to the drain 6012 of transistor 601 through transistor 604 when transistors 602 and 603 are off serves to maintain the parasitic capacitance coupled to the drain 6012 of transistor 601 at the Vdd voltage which has been found to increase both speed and linearity of the current switching function of current switching circuits 303 and 304.

Looking back at the relationship between the charge/discharge current, the time period of charge/discharge, the total capacitance value and the voltage across that capacitance, we see that the time for charging or discharging is inversely proportional to the current. Thus, by increasing the current the time to charge or discharge the capacitor arrays 320 and 330 can be reduced, providing a greater sensitivity to the time difference between rising edges of the refclk 202 and fbclk 242. To accomplish an increase in current, multiple current switching circuits 303 can be connected in parallel between the node 7052 and the common ground 610, and multiple current switching circuits 304 can be connected in parallel between the node 7062 and the common ground 610.

To provide greater flexibility, the number of functional multiple paralleled current switching circuits can be digitally selectable to make the time to digital conversion more precise when required, as when there is little time difference between the rising edges of the refclk 202 and fbclk 242, for example. To provide such functionality, time to digital converter 300 may optionally include the current switching unit 340'. Current switching unit 340' includes a plurality of current switching circuits 303a-303n, arranged in parallel with respect to the node 7052 and each enabled by the DOWN signal and a respective inten signal, and a plurality of current switching circuits 304a-304n arranged in parallel with respect to the node 7062 and each enabled by the UP signal and the respective inten signal. Selection of the number of paralleled current switching circuits 303a-303n and 304a-304n is controlled by the sensitivity selection control 350 which enables the selected current switching circuits via digital output signal lines of the bus 352. There are many well known ways for accomplishing the enablement of the selected current switching circuits. For instance, the NAND gates 605 of each current switching circuit 303, 304 can be replaced with a three input NAND gate with the selection signal output by sensitivity selection control 350 on a respective one of the digital output signal lines of bus 352 connected to the third input. Alternately the inten signal 814 can be gated to those of the paralleled current switches that are being selected for operation.

Figure 6B:
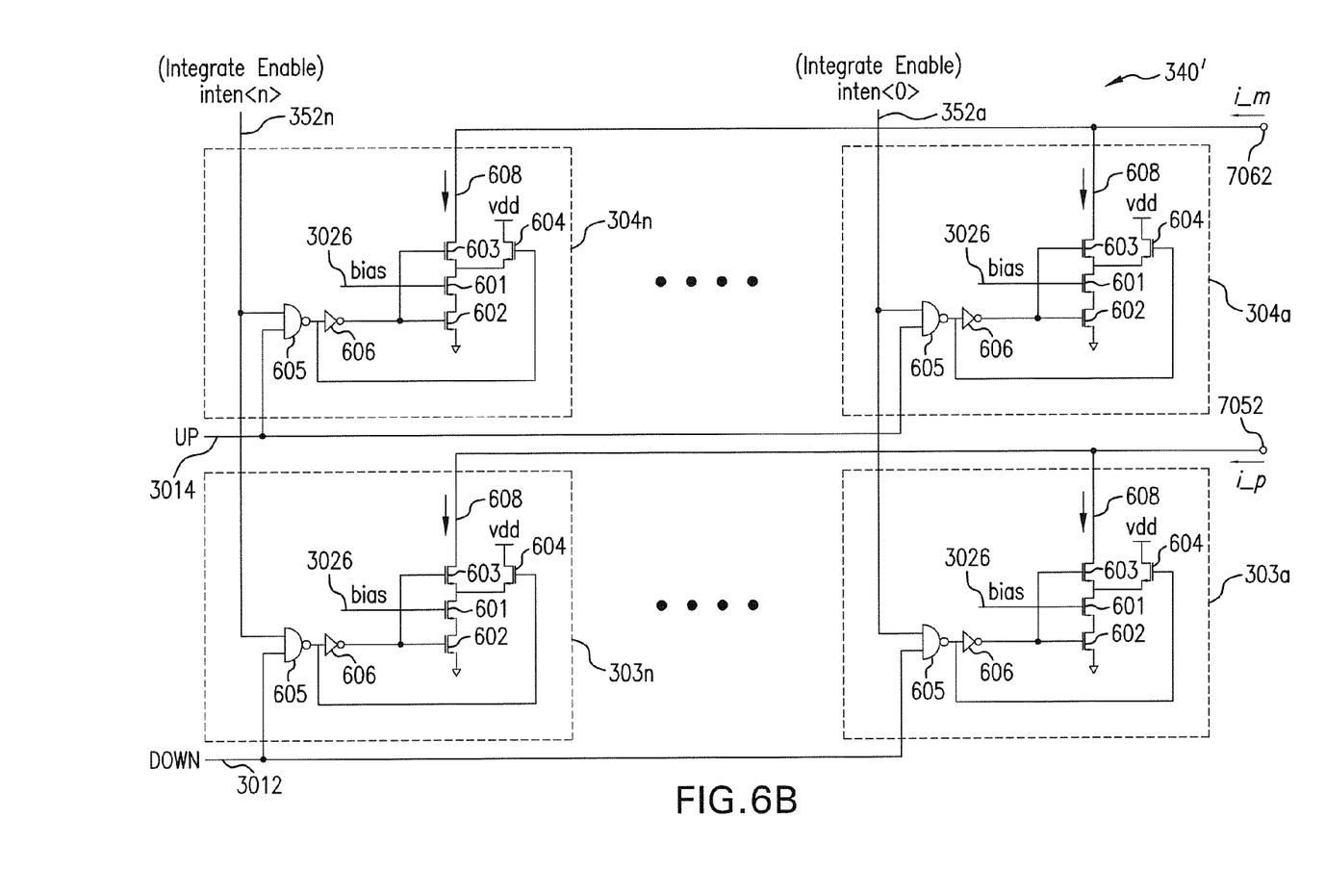
FIG. 6B is a schematic diagram illustrating a current switching unit with selectable sensitivity usable in the time to digital converter of FIG. 3
Figure 8:
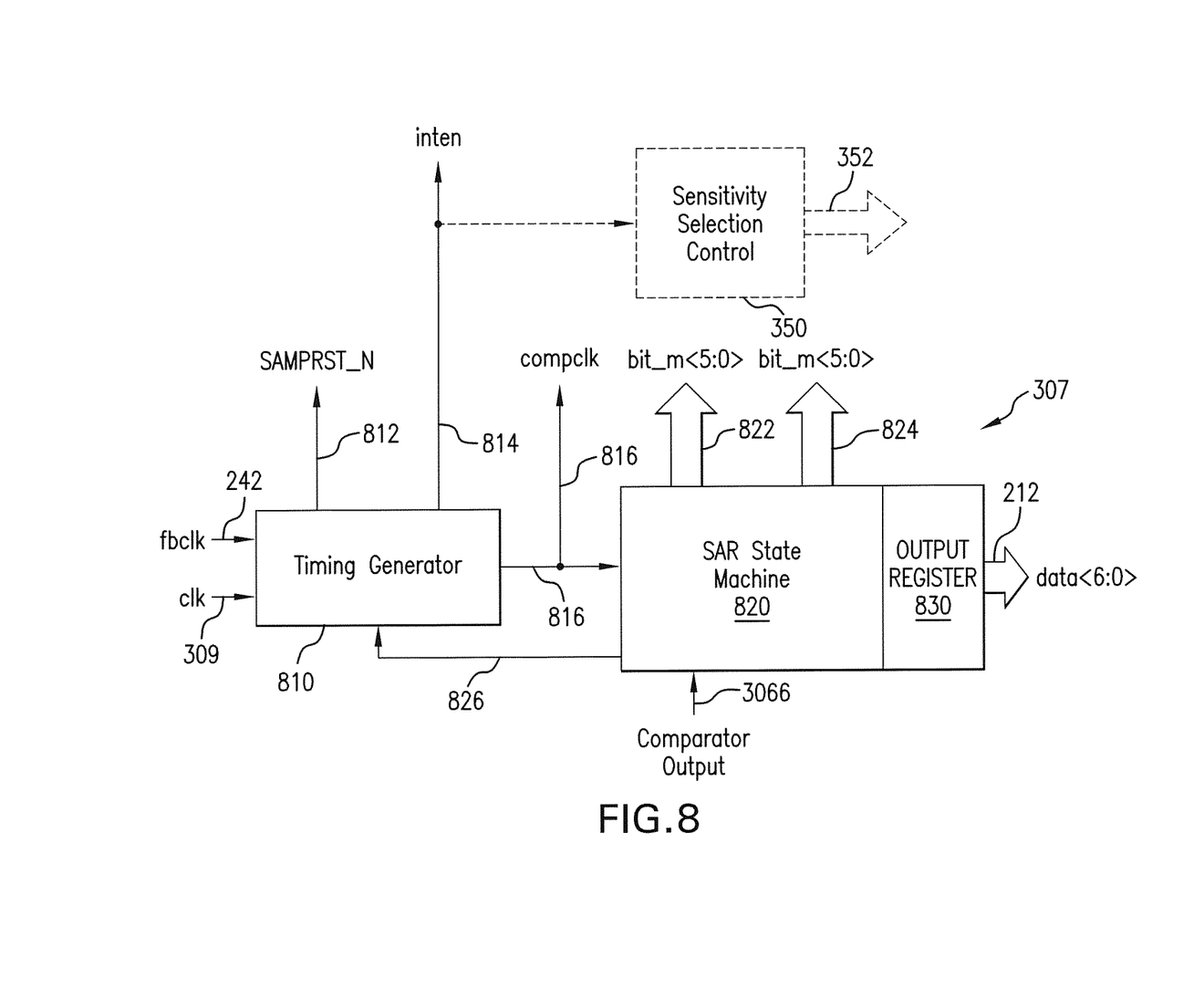
FIG. 8 is a simplified block diagram of the timing and logic portions of the successive approximation architecture of the present invention.

Turning to FIGS. 6B and 8, there is shown another exemplary scheme for selecting a number of the multiple paralleled current switching circuits 303a-303n and 304a-304n by the sensitivity selection control 350. Responsive to input of the system clock signal (clk) 309 and the fbclk signal 242, the timing generator 810 generates the signals that control the operation of the sequence of operations of time to digital converter 300. One of those signals is the inten signal 814 that is used by the phase-frequency detector 301 and is one input of each of the current switching circuits that is required for their enablement. By selectively gating the inten signal 814 through respective digital output signal lines 352a-352n to provide a corresponding one of the gated inten<0>-inten<n> signals only to those of the plurality of the paralleled current switching circuits 303a-303n and 304a-304n to be enabled, sensitivity selection control 350 can efficiently implement the sensitivity selection function.

As illustrated in FIG. 6B, the current coupling lines 608 of each of the plurality of current switching circuits 304a-304n are connected in common to the node 7062 and the respective inputs for the UP signal 3014 are connected in common for receipt of that signal. Similarly, the current coupling lines 608 of each of the plurality of current switching circuits 303a-303n are connected in common to the node 7052 and the respective inputs for the DOWN signal 3012 are connected in common for receipt of that signal. Corresponding pairs of current switching circuits 304a and 303a; ... 304n, 303n have respective inputs for the inten signal commonly coupled to a corresponding one of the digital output signal lines 352a-352n for receiving a respective inten<0>-inten<n> signal when that particular pair of current switching circuits 303, 304 is selected by the sensitivity selection control 350.

The current switched by the current switching unit 340, 340' is supplied by the capacitor DAC 305, which is shown in greater detail in FIG. 7. The differential capacitor DAC 305 includes a pair of arrays of weighted capacitors 320 and 330. In the exemplary time to digital converter, a seven bit SAR ADC 310 is illustrated and thus, six switched weighted capacitors are used plus one unswitched capacitor is employed in each of the arrays 320 and 330 of the capacitor DAC 305. The capacitors 710a and 712a represent the least significant bit (LSB) for each array with the other capacitors in each respective array having values which are binary multiples of the value C of capacitors 710a and 712a, as is conventional for a differential capacitor DAC. Accordingly, capacitors 710b and 712b have vales of 2C, capacitors 710c and 712c have values of 4C, and so on, with capacitors 710f and 712f, representing the most significant bit (MSB), have values of 32C. The unswitched capacitors 714 and 716 have values that are a multiple of the LSB capacitance C, with the multiple of the value C being selected so that the common mode DAC voltage supplied to the differential comparator never falls below the comparator's operating threshold. The number of bits of the successive approximation analog to digital converter circuitry 310 is exemplary and may be greater or fewer, depending upon the particular application of time to digital converter, without departing from the inventive concepts disclosed herein.

The DAC's operative cycle begins with the output of the SAMPRST_N signal 812, a pulse that transitions from a logic 1 to a logic 0, output from the timing generator 810. As illustrated in the timing diagram of FIG. 4, the SAMPRST_N signal 812 precedes the output of the iten signal 814 output from timing generator 810. The SAMPRST_N signal 812 is coupled to the gate 7022 of a PMOS transistor 702 and the gate 7042 of the PMOS transistor 704. So, when the SAMPRST_N signal 812 transitions to the logic 0 level, transistors 702 and 704 are switched to an on state. Transistor 702 switches the Vdd reference voltage 312 coupled to its source 7026 to its drain 7024 coupled to the net 705, and transistor 704 switches the Vdd reference voltage 312 coupled to its source 7046 to its drain 7044 coupled to the net 706. At this time the successive approximation bit lines 822a-822f and 824a-824f, supplied from the SAR state machine 820 of the successive approximation logic and timing unit 307, are all held at a logic 0, and thus, the outputs of all of the inverters 720a-720f and 722a-722f will all be at a logic 1, the Vdd voltage. Therefore all of the capacitors of both arrays 320 and 330 will be initialized with the Vdd voltage on both sides of the capacitors and will have no charge.

Next, the SAMPRST_N signal 812, transitions back to a logic 1, turning off transistors 702 and 704, and the iten signal 814 transitions to a logic 1 to enable operation of the current switching unit 340,340', as previously described. During this integration or charge redistribution phase, the successive approximation bit lines 822a-822f and 824a-824f remain at a logic 0. As the inverter side of the capacitors remain at the Vdd reference voltage while the nets 705 and 706 are pulled towards the common ground reference 610 via the respective current switching circuits 303 and 304 responsive to the DOWN and UP signals 3012 and 3014, charge is pulled from the capacitor arrays 320 and 330 in proportion to the DOWN and UP signals 3012 and 3014. This integration phase is ended by transition of the iten signal 814 back to a logic 0, disabling the current switching unit 340, 340'. The successive approximation conversion phase follows the integration phase.

Turning back to FIGS. 3 and 8, the timing generator 810 outputs the compclk signal 816 to the SAR state machine 820 and the comparator 306. Comparator 306 is a conventional "strong arm" comparator that is frequently used in successive approximation analog to digital converters and therefore there is no need to describe the circuit details of that device herein. Comparator 306 is a clocked comparator, clocked by the compclk signal 816, to compare the comp_p voltage 3062 from node 7052 with the comp_m voltage 3064 from node 7062. For the example illustrated in the timing diagram of FIG. 4, the DOWN signal 3012 has the narrower pulse width t2, so the current switching circuit 303 pulled less charge from the weighted capacitor array 320 than was pulled from the weighted capacitor array 330 by the UP signal 3014. Accordingly, the comp_m voltage 3064 will be greater than the comp_p voltage 3062 for this first comparison. Responsive to the comp_m voltage 3064 being greater than the comp_p voltage 3062, comparator 306 generates a logic 0 output on line 3066 that is coupled to the SAR state machine 820 of the successive approximation logic and timing unit 307. The SAR state machine 820 uses the comparator output to determine the digital outputs on buses 822 and 824 and stores that output in the register 820. The SAR state machine 820 next outputs a logic 1 on the bit line to the side of the capacitor array, 320 or 330, having the higher voltage for the bit determined by the comparator according to the state machine. In this example, the bit line 824f, representing the MSB, is switched from the initial logic 0 level to a logic 1 at the input of inverter 722f. The logic level of all other bit lines going to both of the capacitor arrays 320 and 330 remain unchanged. That puts the side of capacitor 712f that was previously at Vdd potential to ground potential, thereby reducing the voltage of the capacitor array 330 by one fourth of the full scale voltage range of the SAR ADC 310, by virtue of its 32C weighting of capacitor 712f.

As illustrated in the timing diagram, the next comparison then proceeds and again the comp_m voltage 3064 is greater than the comp_p voltage 3062, resulting in a logic 0 output from comparator 306. The SAR state machine 820 stores this bit of next lower significance in the successive approximation register internal to the successive approximation logic and timing unit 307 and changes the bit of next lower significance line, bit line 824e, from the initial logic 0 level to a logic 1 at the input of inverter 722e. The logic level of all other bit lines going to both of the capacitor arrays 320 and 330 remain unchanged. That puts the side of capacitor 712e that was previously at Vdd potential to ground potential, thereby further reducing the voltage of the capacitor array 330 by, this time, one eight of the full scale range of the SAR ADC 310, by virtue of its 16C weighting of capacitor 712e. The resulting reduction in voltage from the switching of capacitor 712e brings the comp_m voltage 3064 below that of the comp_p voltage 3062, as illustrated in the timing diagram. Therefore, this next comparison by comparator 306 results in a logic 1 output.

The SAR state machine 820 stores the result of this third comparison in the next lower significant bit in the successive approximation register internal to the successive approximation logic and timing unit 307 and now will change the logic state of a bit line, bit_p<3>, 822d of the capacitor array 320, the array now having the higher voltage. That results in the inverter outputting a logic 0 and switching the capacitor 710d to reduce the compp voltage 3062 by one sixteenth the SAR ADC 310 full scale range, by virtue of its 8C weighting of capacitor 710d. The resulting reduced comp_p voltage 3062 and the unchanged comp_m voltage 3064 are again compared and for this example, the comparator again outputs a logic 1. It should therefore be understood that the size (weighting) of the capacitor switched by each successive step of the SAR state machine 820, subsequent to the first conversion cycle, is half that of the size of the capacitor switched in the preceding cycle. The side of the array capacitor array where the selected capacitor is switched is determined by the preceding comparator output value, selecting the capacitor array of higher voltage. This successive approximation search continues in this fashion until the last of the seven of the bits, the LSB, of the exemplary successive approximation analog to digital to analog converter circuitry 310 has been resolved.

Upon completion of the successive approximation conversion phase, the successive approximation register internal to the successive approximation logic and timing unit 307 transfers the digital word stored therein to the output register 830, from which the digital word stored therein is output on the output bus 212. The completion of the successive approximation conversion phase results in a completion signal being generated by the SAR state machine 820 that is output on coupling line 826 and input to the timing generator 810 for restarting the timing sequence for the next computational cycle.

As seen in the timing diagram, this process brings the magnitude of the comp_p voltage 3062 and the comp_m voltage 3064 ever closer together with each successive operation of the successive approximation analog to digital to analog converter circuitry 310. Consequently, the digital output stored in the output register 830 represents the difference in the voltages that resulted from the redistribution of charge initiated by the switching unit 340, 340' responsive to the UP signal 3014 and DOWN signal 3012. Since that resulting difference in voltage corresponds to the time difference between rising edges of the refclk signal 202 and the fbclk signal 242, the digital value output from output register 830 equates to a digital representation of that time difference which is usable in digital PPL applications, as well as other applications.

The descriptions above are intended to illustrate possible implementations of the present invention and are not restrictive. While this invention has been described in connection with specific forms and embodiments thereof, it will be appreciated that various modifications other than those discussed above may be resorted to without departing from the spirit or scope of the invention. Such variations, modifications, and alternatives will become apparent to the skilled artisan upon review of the disclosure. For example, functionally equivalent elements or method steps may be substituted for those specifically shown and described, and certain features may be used independently of other features, and in certain cases, particular locations of elements or sequence of method steps may be reversed or interposed, all without departing from the spirit or scope of the invention as defined in the appended Claims. The scope of the invention should therefore be determined with reference to the description above and the appended claims, along with their full range of equivalents.

What is claimed is:

1. A time to digital converter comprising:
a phase-frequency detection circuit having a pair of inputs respectively receiving first and second signals, said phase-frequency detection circuit generating both an up and a down control signal at corresponding outputs thereof, one of said up and down control signals having a pulse width representing a time difference between leading edges of said first and second signals, one relative to the other;
a capacitor digital to analog converter operatively coupled to the outputs of said phase-frequency detection circuit, said capacitor digital to analog converter having a pair of capacitor arrays each redistributing charge in correspondence to said pulse width of a corresponding one of said up and down control signals and sequentially switching selected capacitors of at least one of said pair of capacitor arrays to establish respective voltage output for each of said pair of capacitor arrays;
a successive approximation logic and timing unit coupled to said capacitor digital to analog converter for controlling the sequential switching of said selected capacitors, said successive approximation logic and timing unit including a successive approximation register; and
a comparator unit operatively coupled to said pair of capacitor arrays for comparing voltage outputs thereof and operatively coupled to said successive approximation logic and timing unit, said comparator unit having an output coupled to said successive approximation register, said comparator generating a bit value respectively for each of a plurality of bit conversion states established by said successive approximation logic and timing unit and outputting said bit values to the successive approximation register to form a digital representation of the time difference between leading edges said first and second signals.

2. The time to digital converter as recited in claim 1, further comprising a current switching unit having a pair of inputs coupled to said outputs of said phase-frequency detection circuit for receiving said up and down control signals and outputs coupled to said capacitor digital to analog converter for establishing said charge redistributed by a corresponding one of said pair of capacitor arrays in correspondence to said pulse width of said corresponding one of said up and down control signals.

3. The time to digital converter as recited in claim 2, where said current switching unit includes at least one first current switching circuit operatively coupled to said up control signal and at least one second current switching circuit operatively coupled to said down control signal.

4. The time to digital converter as recited in claim 3, where each of said first and second current switching circuits includes a first transistor and at least one second transistor coupled in series, said first transistor being biased to establish a current switched by said at least one second transistor to establish said charge redistributed by a corresponding one of said pair of capacitor arrays in correspondence to said pulse width of said corresponding one of said up and down control signals.

5. The time to digital converter as recited in claim 4, where each of said first and second current switching circuits further includes a third transistor coupled between a reference voltage and a drain of said first transistor, said third transistor being switched on to maintain a charge on a parasitic capacitance of said drain of said first transistor when said at least one second transistor is switched off.

6. The time to digital converter as recited in claim 3, where each of said first and second current switching circuits includes a first transistor and a pair of second transistors coupled in series, said first transistor being biased to establish a current switched by said pair of second transistors to establish said charge redistributed by a corresponding one of said pair of capacitor arrays in correspondence to said pulse width of said corresponding one of said up and down control signals, a source of one of said pair of second transistors being coupled to a drain of said first transistor and a drain of the other of said pair of second transistors being coupled to a source of said first transistor.

7. The time to digital converter as recited in claim 6, where each of said first and second current switching circuits further includes a third transistor coupled between a reference voltage and said drain of said first transistor, said third transistor being switched on to maintain a charge on a parasitic capacitance of said drain of said first transistor when said pair of second transistors are switched off.

8. The time to digital converter as recited in claim 3, where said current switching unit includes a plurality of first current switching circuits coupled in parallel relationship and operatively coupled to said up control signal, and a plurality of second current switching circuits coupled in parallel relationship and operatively coupled to said down control signal.

9. The time to digital converter as recited in claim 3, where said current switching unit includes a selected portion of a plurality of first current switching circuits coupled in parallel relationship and operatively coupled to said up control signal, and a selected portion of a plurality of second current switching circuits coupled in parallel relationship and operatively coupled to said down control signal, said selected portions of said plurality of first and said plurality of second current switching circuits being equal to one another.

10. The time to digital converter as recited in claim 8, where each of said plurality of first current switching circuits and each of said plurality of second current switching circuits includes a first transistor and at least one second transistor coupled in series, said first transistor being biased to establish a current switched by said at least one second transistor to establish said charge redistributed by a corresponding one of said pair of capacitor arrays in correspondence to said pulse width of said corresponding one of said up and down control signals.

11. The time to digital converter as recited in claim 10, where each of said plurality of first current switching circuits and each of said plurality of second current switching circuits further includes a third transistor coupled between a reference voltage and a drain of said first transistor, said third transistor being switched on to maintain a charge on a parasitic capacitance of said drain of said first transistor when said at least one second transistor is switched off.

12. The time to digital converter as recited in claim 9, where each of said selected portion of said plurality of first current switching circuits and each of said selected portion of said plurality of second current switching circuits includes a first transistor and at least one second transistor coupled in series, said first transistor being biased to establish a current switched by said at least one second transistor to establish said charge redistributed by a corresponding one of said pair of capacitor arrays in correspondence to said pulse width of said corresponding one of said up and down control signals.

13. The time to digital converter as recited in claim 12, where each of said selected portion of said plurality of first current switching circuits and each of said selected portion of said plurality of second current switching circuits further includes a third transistor coupled between a reference voltage and a drain of said first transistor, said third transistor being switched on to maintain a charge on a parasitic capacitance of said drain of said first transistor when said at least one second transistor is switched off.

14. The time to digital converter as recited in claim 9, where said selected portion of said plurality of first current switching circuits and said selected portion of said plurality of second current switching circuits are enabled responsive to control signals from a controller to adjust a current gain of said current switching unit.

15. A time to digital converter comprising:
a phase-frequency detection circuit having a pair of inputs respectively receiving first and second signals, said phase-frequency detection circuit generating both an up and a down control signal at corresponding outputs thereof, each of said up and down control signals having a pulse width and one of said up and down control signals having said pulse width thereof representing a time difference between receipt of leading edges of said first and second signals;
a current switching unit having a pair of inputs coupled to said phase-frequency detection circuit for receiving said up and down control signals, said current switching unit generating an up current signal for a first time period corresponding to said pulse width of said up control signal and generating a down current signal for a second time period corresponding to said pulse width of said down control signal; and
a successive approximation analog to digital converter having a capacitor digital to analog converter operatively coupled to said current switching unit for generating a respective voltage corresponding to each of said up and down current signals, said successive approximation analog to digital converter generating a digital representation of a difference between said voltages of said capacitor digital to analog converter to define said time difference between receipt leading edges of said first and second signals.

16. The time to digital converter as recited in claim 15, where said successive approximation analog to digital converter includes:
a successive approximation logic and timing unit coupled to said capacitor digital to analog converter for controlling sequential switching of selected capacitors thereof, said successive approximation logic and timing unit including a successive approximation register; and
a comparator unit operatively coupled to said capacitor digital to analog converter for comparing voltage outputs thereof and operatively coupled to said successive approximation logic and timing unit, said comparator unit having an output coupled to said successive approximation register, said comparator generating a bit value respectively for each of a plurality of bit conversion states established by said successive approximation logic and timing unit and outputting said bit values to the successive approximation register to form said digital representation of the time difference between receipt of leading edges of said first and second signals.

17. The time to digital converter as recited in claim 15, where said capacitor digital to analog converter includes a pair of capacitor arrays coupled to said current switching unit and each of said pair of capacitor arrays redistributing charge in correspondence to a corresponding one of said first and second time periods of a respective up and down current signal and subsequently sequentially switching selected capacitors of at least one of said pair of capacitor arrays to establish a respective voltage output for each of said pair of capacitor arrays; and,
said successive approximation analog to digital converter further includes:
a successive approximation logic and timing unit coupled to said capacitor digital to analog converter for controlling said sequential switching of selected capacitors of said pair of capacitor arrays, said successive approximation logic and timing unit including a successive approximation register; and
a comparator unit operatively coupled to said pair of capacitor arrays for comparing voltage outputs thereof and operatively coupled to said successive approximation logic and timing unit, said comparator unit having an output coupled to said successive approximation register, said comparator generating a bit value respectively for each of a plurality of bit conversion states established by said successive approximation logic and timing unit and outputting said bit values to the successive approximation register to form said digital representation of the time difference between receipt of leading edges of said first and second signals.

18. The time to digital converter as recited in claim 17, where said current switching unit includes at least one first current switching circuit operatively coupled to said up control signal and at least one second current switching circuit operatively coupled to said down control signal.

19. The time to digital converter as recited in claim 18, where each of said first and second current switching circuits includes a first transistor and at least one second transistor coupled in series, said first transistor being biased to establish a current switched by said at least one second transistor to establish said charge redistributed by a corresponding one of said pair of capacitor arrays in correspondence to said pulse width of said corresponding one of said up and down control signals.

20. The time to digital converter as recited in claim 19, where each of said first and second current switching circuits further includes a third transistor coupled between a reference voltage and a drain of said first transistor, said third transistor being switched on to maintain a charge on a parasitic capacitance of said drain of said first transistor when said at least one second transistor is switched off.

21. The time to digital converter as recited in claim 17, where said current switching unit includes a plurality of first current switching circuits coupled in parallel relationship and operatively coupled to said up control signal, and a plurality of second current switching circuits coupled in parallel relationship and operatively coupled to said down control signal.

22. The time to digital converter as recited in claim 21, further comprising a sensitivity selection control coupled to said plurality of first and second current switching circuits for enabling a selected number of each of said plurality of first and second current switching circuits to control a rate of said charge redistribution of said pair of capacitor arrays.

23. The time to digital converter as recited in claim 15, further comprising a sensitivity selection control coupled to said current switching unit for selecting a magnitude of said up and down current signals for selectively establishing a rate of charge redistribution in said capacitor digital to analog converter to thereby select a precision of said digital representation of said difference between said voltages of said capacitor digital to analog converter.

24. A method of converting a measured time period representing a time difference between receipt of leading edges of a pair of signals to a digital representation thereof, the method comprising:
 detecting a rising edge of each of said pair of signals and measuring a time difference therebetween;
 generating two control signals with each having a pulse width where a difference in pulse width between said two control signals is equivalent to said measured time difference;
 respectively redistributing charge in a pair of arrays of binary-weighted capacitors respectively responsive to said two control signals to establish corresponding voltages thereacross, a difference between the voltages across said pair of arrays of binary-weighted capacitors thereby being equivalent to said measured time difference; and
 successively comparing the voltages established across selected ones of said binary-weighted capacitors between said pair of arrays of binary-weighted capacitors and storing a result thereof in a register to generate in said register a digital representation of said measured time difference.

25. The method as recited in claim 24, where said respectively redistributing charge in a pair of arrays of binary-weighted capacitors includes switching a current between each of said pair of arrays of binary-weighted capacitors and a reference potential, said current being switched to one of said pair of arrays of binary-weighted capacitors for a time period corresponding to said pulse width of one of said two control signals and said current being switched to the other of said pair of arrays of binary-weighted capacitors for a time period corresponding to said pulse width of the other of said two control signals.

26. The method as recited in claim 25, where said switching a current between each of said pair of arrays of binary-weighted capacitors and a reference potential includes selecting a magnitude of said current to thereby select a precision of said digital representation of said measured time difference.

* * * * *